United States Patent
Winn

(10) Patent No.: US 10,121,269 B1
(45) Date of Patent: Nov. 6, 2018

(54) VISUALIZATION SETTINGS TRANSFER IN A MULTI-USER CAX TOOL

(71) Applicant: United Technologies Corporation, Hartford, CT (US)

(72) Inventor: Joshua Daniel Winn, Ellington, CT (US)

(73) Assignee: United Technologies Corporation, Farmington, CT (US)

( * ) Notice: Subject to any disclaimer, the term of this patent is extended or adjusted under 35 U.S.C. 154(b) by 104 days.

(21) Appl. No.: 14/882,614

(22) Filed: Oct. 14, 2015

Related U.S. Application Data

(60) Provisional application No. 62/063,450, filed on Oct. 14, 2014.

(51) Int. Cl.
*G06F 17/50* (2006.01)
*G06T 11/20* (2006.01)

(52) U.S. Cl.
CPC ............ *G06T 11/206* (2013.01); *G06F 17/50* (2013.01)

(58) Field of Classification Search
None
See application file for complete search history.

(56) References Cited

U.S. PATENT DOCUMENTS

| | | | |
|---|---|---|---|
| 8,229,715 B1 | 7/2012 | Teller et al. | |
| 2006/0265496 A1* | 11/2006 | Freitag | G06F 17/50 709/224 |
| 2007/0038893 A1* | 2/2007 | Junghans | G06F 17/50 714/30 |
| 2013/0125029 A1* | 5/2013 | Miller | G06F 9/45529 715/760 |
| 2013/0144566 A1 | 6/2013 | De Biswas | |
| 2014/0222387 A1 | 8/2014 | Cannon et al. | |
| 2014/0222919 A1 | 8/2014 | Nysetvold et al. | |
| 2014/0236550 A1 | 8/2014 | Nysetvold et al. | |

OTHER PUBLICATIONS

Xu, Yue, "A Flexible Context Architecture for a Multi-User GUI," Department of Mechanical Engineering, Brigham Young University, Dec. 2010.
Red, E., French, D., Hepworth, A., Jensen, G., Stone, B., "Multi-User Computer-Aided Design and Engineering Software Applications," Cloud-Based Design and Manufacturing (CBDM), Springer International Publishing, Jan. 1, 2014, pp. 25-62.
Red, E., Jensen, G., Ryskamp, J., Mix, K., "NXConnect: Multi-User CAx on a Commercial Engineering Software Application," Department of Mechanical Engineering, Brigham Young University, 2010.

\* cited by examiner

*Primary Examiner* — Yu Chen
(74) *Attorney, Agent, or Firm* — Carlson, Gaskey & Olds, P.C.

(57) ABSTRACT

A system for component visualization according to an exemplary aspect of the present disclosure includes, among other things, a data module configured to access data corresponding to a component design, the component design including at least one feature corresponding to a group of feature types. The system includes a display module configured to display the data in an environment according to a visualization setting corresponding to a first user profile and corresponding to the group of feature types. The system includes a comparison module configured to cause the display module to display the data according to the visualization setting when the at least one feature meets at least one predetermined criterion. A method for designing a component is also disclosed.

9 Claims, 6 Drawing Sheets

US 10,121,269 B1

VISUALIZATION SETTINGS TRANSFER IN A MULTI-USER CAX TOOL

CROSS-REFERENCE TO RELATED APPLICATION

The present disclosure claims priority to U.S. Provisional Patent Application No. 62/063,450, filed Oct. 14, 2014.

BACKGROUND

This disclosure relates to computer-aided technologies (CAx), and more particularly, to visualization of component designs in a computing environment.

CAx software is used to develop tools, parts, assemblies, structures and other components using a computer system during the design, analysis, and manufacturing phases, for example. CAx software may be used by a user or group of users to build, analyze, and manufacture complex elements. CAx software is typically restricted to a single user paradigm, wherein only a single user can edit a model or part file within a CAx software application at a time. The user must exit the file before another user is allowed to access it.

SUMMARY

A system for component visualization according to an example of the present disclosure includes a data module configured to access data corresponding to a component design. The component design includes at least one feature corresponding to a group of feature types. A display module is configured to display the data in an environment according to a first visualization setting corresponding to a first user profile and corresponding to the group of feature types. An interface module is configured to receive a second visualization setting corresponding to a second user profile and corresponding to the group of feature types. A comparison module is configured to cause the display module to display the data according to the second visualization setting when the second visualization setting meets at least one predetermined criterion.

In a further embodiment of any of the foregoing embodiments, the group of feature types includes at least one of a datum, a geometrical shape, a sketch, an extrusion, and a surface feature.

In a further embodiment of any of the foregoing embodiments, the at least one predetermined criterion is at least partially based on the group of feature types.

In a further embodiment of any of the foregoing embodiments, the at least one predetermined criterion is at least partially based on at least one layer corresponding to the group of feature types.

A system for component visualization according to an example of the present disclosure includes a data module configured to access data corresponding to a component design. The component design includes at least one feature corresponding to a group of feature types. A display module is configured to display the data in an environment according to a visualization setting corresponding to a first user profile and corresponding to the group of feature types. A comparison module is configured to cause the display module to display the data according to the visualization setting when the at least one feature meets at least one predetermined criterion, the at least one feature being related to a second user profile.

In a further embodiment of any of the foregoing embodiments, the group of feature types includes at least one of a datum, a geometrical shape, a sketch, an extrusion, and a surface feature.

In a further embodiment of any of the foregoing embodiments, the at least one predetermined criterion is at least partially based on the group of feature types.

In a further embodiment of any of the foregoing embodiments, the at least one predetermined criterion is at least partially based on at least one layer corresponding to the group of feature types.

In a further embodiment of any of the foregoing embodiments, the at least one predetermined criterion is at least partially based on an editing state of the environment.

In a further embodiment of any of the foregoing embodiments, the at least one predetermined criterion is at least partially based on an entity list corresponding to the second user profile.

A method for designing a component according to an example of the present disclosure includes displaying a component design according to a first visualization setting, the first visualization setting corresponding to a first user profile and corresponding to a group of feature types. The component design includes at least one feature corresponding to the group of feature types, and the at least one feature relates to a second user profile. The method includes displaying the at least one feature in the environment when at least one predetermined criterion is met.

In a further embodiment of any of the foregoing embodiments, the group of feature types includes at least one of a datum, a geometrical shape, a sketch, an extrusion, and a surface feature.

In a further embodiment of any of the foregoing embodiments, the at least one predetermined criterion is at least partially based on at least one of: (1) the group of feature types, (2) at least one layer corresponding to the group of feature types, and (3) the at least one feature.

In a further embodiment of any of the foregoing embodiments, the predetermined criterion is at least partially based on an editing state of the environment.

A further embodiment of any of the foregoing embodiments includes receiving a second visualization setting corresponding to the second user profile and corresponding to the group of feature types. The step of displaying the at least one feature includes displaying the at least one feature in the environment according to the second visualization setting when the second visualization setting meets the at least one predetermined criterion.

In a further embodiment of any of the foregoing embodiments, the second visualization setting includes filtering criterion corresponding to the at least one feature.

In a further embodiment of any of the foregoing embodiments, the predetermined criterion is at least partially based on an entity list corresponding to the second user profile.

A further embodiment of any of the foregoing embodiments includes requesting the second visualization setting prior to the step of displaying the at least one feature.

In a further embodiment of any of the foregoing embodiments, the step of displaying the at least one feature is performed in response to modification of the component design by the second user profile.

In a further embodiment of any of the foregoing embodiments, the predetermined criterion is at least partially based on at least one of a part identifier and an assembly identifier each corresponding to the component design.

The various features and advantages of this disclosure will become apparent to those skilled in the art from the following detailed description. The drawings that accompany the detailed description can be briefly described as follows.

BRIEF DESCRIPTION OF THE DRAWINGS

The various features and advantages of the disclosed examples will become apparent to those skilled in the art from the following detailed description. The drawings that accompany the detailed description can be briefly described as follows.

DETAILED DESCRIPTION

Figure 1:
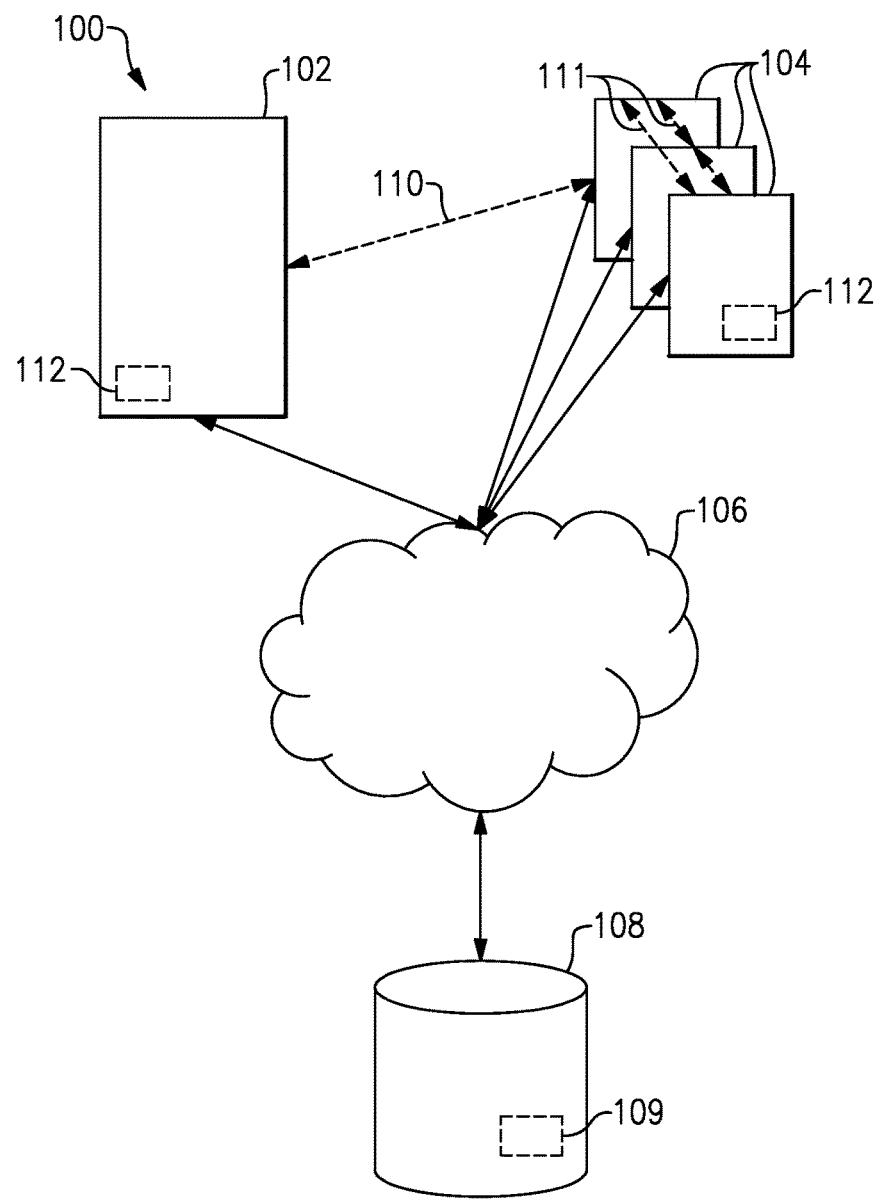
FIG. 1 illustrates an example system for a multi-user CAx environment, according to an embodiment.

FIG. 1 illustrates an example computing architecture or system 100 for executing a multi-user CAx environment, according to an embodiment. The system 100 includes a host computer 102. The host computer 102 may include one or more of a computer processor, memory, storage means, network device, and input and/or output devices and/or interfaces. The host computer 102 is configured to execute one or more software programs. In one example, the host computer 102 is more than one computer jointly configured to process software instructions serially or in parallel.

In some examples, the host computer 102 is in communication with one or more networks such as a network 106 comprised of one or more computing devices. The system 100 additionally includes one or more client computers 104. The host computer 102 and the one or more client computers 104 typically include one or more of a computer processor, memory, storage means, network device and input and/or output devices and/or interfaces according to some examples. The memory may, for example, include UVPROM, EEPROM, FLASH, RAM, ROM, DVD, CD, a hard drive, or other computer readable medium which may store data and/or the CAx software of this description. The host computer 102 and the one or more client computers 104 may be a desktop computer, laptop computer, smart phone, tablet, or any other computer device. In some examples, one or more of the host computer 102 and the one or more client computers 104 include an input device, such as a keyboard and mouse, and one or more output devices such as a monitor, speakers, printers, etc. The interface facilitates communication with the other systems and/or components of the network 106.

In some embodiments of a multi-user CAx environment, each of the client computers 104 is a user workstation capable of accessing and locally running CAx software and providing a CAx environment 112. In some examples, the CAx environment 112 is operable to perform one or more CAx functions including at least one CAx tool, including a computer-aided design (CAD), computer-aided engineering (CAE) and/or computer-aided manufacturing (CAM) tool, for example. In other embodiments, at least one of the client computers 104 is operable to execute different CAx functions. In some embodiments, the CAx environment 112 provides a display or visualization of a component design stored in at least one part file, accordingly to one or more visualization settings, and can be provided via a graphical user interface (GUI).

In some embodiments, the one or more client computers 104 are configured to communicate with the host computer 102 directly via a direct client interface 110 or over the network 106. The one or more client computers 104 are configured to execute one or more software programs, such as a CAx package. In some embodiments, the CAx package is configured to communicate with the host computer 102 either over the network 106 or directly through the direct client interface 110. In another example, the one or more client computers 104 are configured to communicate with each other directly via a peer-to-peer interface 111.

The network 106 may be a private local area network (LAN), a private wide area network (WAN), the Internet, a mesh network, or any other network as is known in the art. The system 100 additionally includes a storage system 108, which in some embodiments is operable to store or otherwise provide data to other computing devices. In one example, the storage system 108 is a storage area network device (SAN) configured to communicate with the host computer 102 and/or the one or more client computers 104 over the network 106. In another example, the storage system 108 is located within the host computer 102 or within at least one of the client computers 104. The storage system 108 may be configured to store one or more of computer software instructions, data, CAx files, database files, configuration information, etc.

In some embodiments, the system 100 is a client-server architecture configured to execute computer software on the host computer 102, which is accessible by the one or more client computers 104 using either a thin client application or a web browser executing on the one or more client computers 104. In some examples, the host computer 102 loads the computer software instructions from local storage, or the storage system 108 into memory and executes the computer software using the one or more computer processors.

In some embodiments of the multi-user CAx architecture, each part file is stored within a database 109 at a central location, for instance at storage system 108. In another example, the database 109 is stored at host computer 102 or is a distributed database provided by one or more of the client computers 104. In some examples, each part file in the database 109 is associated with a sub-assembly or assembly.

Each part file comprises one or more features, each feature corresponding to one or more feature type. In some embodiments, the part file includes a part tree or another data structure to organize and associate the features in a parent-child relationship between different features and/or part files. Each feature can be applied to one or more base features which together comprise the component design.

The term "feature type" is defined as a geometric or non-geometric operation, or a result of such operation, available in a CAx tool to characterize a component design. The various feature types can be stored in one or more software libraries as one or more data classes which can be instantiated by the CAx tool.

The term "feature" refers to an instance of a feature type or a result of its operation (such as a geometric object). Each feature is represented by a data set and has one or more parameters or attributes, such as a unique feature identifier, a feature type, a relative or absolute spatial position or orientation, body type such as a wireframe or solid, and/or its hierarchical relation to other features in a part tree, for example.

Some geometric feature types include two-dimensional sketches comprised of one or more one-dimensional geometries, such as points, lines or curves, and two-dimensional geometries such as rectangles or ellipses. A sketch, in some instances, provides a rough approximation of the desired dimensioning of the various aspects of a component design. In yet other examples, the feature types include various operations to create or modify solid(s) or other three-dimensional geometry such as wireframes, from one or two dimensional features. These various feature types include extrude(s), revolve(s), loft(s), sweep(s), chamfer(s), boundaries, and meshes, for example. The feature types can include operations such as a Boolean operation to add or subtract one feature from another feature, a mirror or a pattern operation to replicate at least one other feature, and an edge blend operation.

Some non-geometric feature types can include various datum such as point(s), plane(s), axes, and coordinate system(s) utilized to arrange or orient other features, and in some instances may not comprise a final design of the component. Other non-geometric feature types can be used to further characterize a base feature comprising a component design, such as surface shading and coloring, material composition and dimensions. Of course, many other feature types utilized to create and further define the various aspects of a component design are contemplated within the teachings of this disclosure.

These various feature types and corresponding features typically have different levels of relevance to various disciplines involved with a component design. Each feature type and feature can also have different levels of applicability with respect to artifacts of the design process, including two-dimensional drawings such as schematics, engineering drawings or blueprints, wireframe models, surface models, and solid models, and also as inputs to other CAx tools such as finite element analysis (FEA) and computational fluid dynamics (CFD) models.

In some embodiments, the CAx environment 112 is configured to designate one or more features or feature types as a layer. Example layers include sketches, wireframes and solids, which in some examples are provided by the CAx software as default layer(s). In other embodiments, a user manually selects feature(s) and/or feature type(s) to be associated with at least one custom layer. In some embodiments, each layer is defined at system initialization, and in other embodiments, each layer is defined during operation. Each layer is utilized to filter the selected features or feature types in a part file loaded into the CAx environment.

Multiple users each provided with a CAx environment 112 via the client computers 104 are able to simultaneously access each part file stored in the database 109 and are able to make modifications to various aspects of a component design corresponding to a part file. In some examples, the part file is stored locally and in the storage system 108, with local copies of the part file at the client computers 104 being synchronized periodically. Modifications to each part file are communicated to each CAx environment currently accessing the part file, either immediately or during synchronization. Display or visualization of the modification is therefore made substantially immediately available in CAx environments accessing the same part file, which can assist the multiple users in identifying conflicts or inconsistencies in various aspects of a component design.

In some instances, the multiple users who use a CAx environment 112 are assigned with different responsibilities and may desire to collaborate with each other on various aspects of the assembly, part or component design. For example, the multiple users may include personnel assigned to a product team, such as a product designer and a draftsman. Draftsmen typically implement a different set of standards and provide a different work product to stakeholders than product designers, and are therefore concerned with different aspects of a component design. Accordingly, a draftsman and a designer may desire to view different aspects of a component design and therefore may select different visualization settings in a CAx environment.

Each of the multiple users is able to select one or more visualization settings in a CAx environment 112. The CAx environment 112 displays selected portions of the component design stored in one or more part files based on these visualization setting(s). Accordingly, modifications or updates made by other user(s) to the component design may not be displayed in the CAx environment 112.

One collaboration technique includes selecting each available visualization setting provided by a CAx environment or package, either during initialization of the CAx environment or prior to collaboration with another user. This permits the user to collaborate on various aspects of the component design by being able to observe the present state of each feature of a part file. This technique, however, may cause the CAx environment 112 to display certain features of the component design that the user is not presently concerned with.

It may be desirable to deselect the visualization of one or more feature types or corresponding features based upon the responsibilities of a particular user, for example. In other embodiments, the user interacting with or otherwise using the CAx environment 112 may desire to restrict the visualization of updates to a part file made by a particular user or a particular group of users. Similarly, the user may desire not to receive updates or view various parts, simple assemblies or assemblies. In other examples, the user may decide not to view updates to various features or feature types based on an editing state of the CAx environment. For example, the user may decline to view updates from another user or group while the user is modifying a component design. In some examples, visualization settings include at least one layer corresponding at least one featured type, or to specific feature(s) comprising a component design.

Accordingly, another collaborative technique includes selecting less than each available visualization setting provided by the CAx environment 112, thereby limiting the features and/or feature types displayed to the user in the CAx environment 112. This technique, however, may cause conflicts in a component design, based on modifications to a part file made by another user.

Figure 2A:
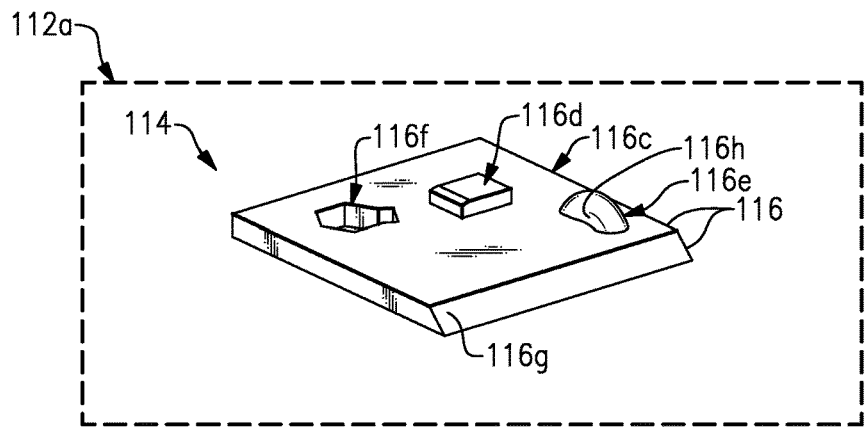
FIG. 2A illustrates a sample component design displayed in a CAx environment, according to an embodiment.
Figure 2B:
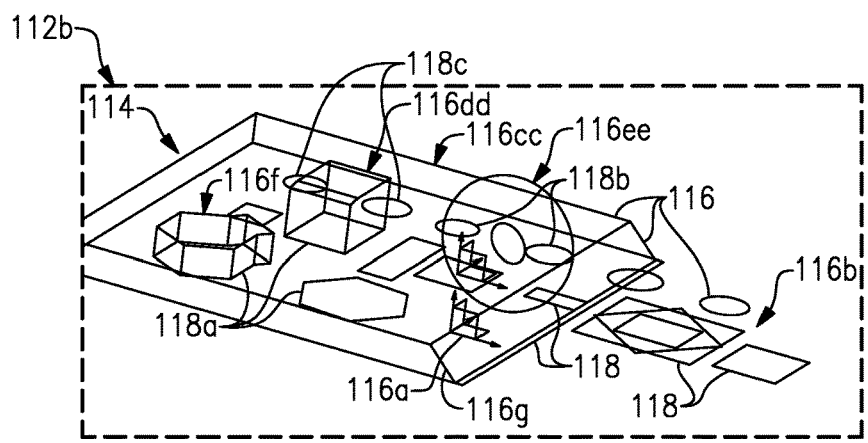
FIG. 2B illustrates the sample component design of FIG. 2A displayed in a second CAx environment, according to an embodiment.

FIGS. 2A and 2B illustrate one example implementation of this technique. In this example, a first user is provided with a first CAx environment 112a, and a second user is provided with a second CAx environment 112b. Each of the CAx environments 112a, 112b is associated with a different one of the client computers 104, for example. As shown, each CAx environment 112 provides a visualization of a component design 114 corresponding to a part file.

The example component design 114 includes one or more features 116 each corresponding to a feature type. The features 116 shown in FIG. 2B include a datum coordinate system 116a, and a sketch 116b having one or more sketch entities or geometries 118 illustrated as ellipses and rectangles, for example. The features 116 shown in FIG. 2A include solids such as extrudes 116c, 116d, which are applied to geometries 118 of the sketch 116b, and are characterized by wireframes 116cc, 116dd as shown in FIG. 2B. Other solid features include a rotate 116e having a toroid-shaped geometry, which is characterized by wireframe 166ee shown in FIG. 2B. Other example features include a hole or Boolean 116f forming an opening in the extrude 116c, and a chamfer 116g applied to extrude 116c. Non-geometric features include surface shading 116h applied to the rotate 116e feature.

FIGS. 2A and 2B also illustrate different visualization settings for CAx environments 112a and 112b. In the CAx environment 112a shown in FIG. 2A, the user has selected at least one visualization setting, either manually or by default, to show solid features 116c, 116d and 116e. In other embodiments, the user designates the solid features type to a first layer, which includes features 116c, 116d, and 116e, and then indicates to the CAx environment 112a to show these features. The user of CAx environment 112a has also selected visualization settings to hide datums, such as datum coordinate system 116a, and also sketch 116b including geometries 118. In a further embodiment, the user defines a second layer including datums such as datum coordinate system 116a, and a third layer including sketches such as sketch 116b. In another embodiment, the user of CAx environment 112a selects a visualization setting to hide updates made from a profile associated with the CAx environment 112b, such as a user profile. This permits the user of CAx environment 112a to view or modify the component design 114 without datum coordinate system 116a and sketch 116b cluttering the viewing screen provided by the CAx environment 112a. As such, the visualization settings of each user can be customized according to the needs of a particular situation even though each of the users is working on the same component/part file.

As illustrated by the CAx environment 112b in FIG. 2B, however, the user has selected at least one visualization setting, by deselecting a layer corresponding to solid features, for example. As such, the solid features 116c, 116d, 116e are hidden, and the corresponding wireframe geometries 116cc, 116dd, and 116ee are shown. This permits the user of the CAx environment 112b to view the geometries 118a, 118b, 118c which would otherwise be obstructed by extrudes 116c, 116d, 116e, for example.

In some instances, a user provided with a CAx environment 112 may desire to receive one or more visualization settings corresponding to CAx environment(s) 112 of other user(s) or group(s). For example, the product designer using the first CAx environment 112a in the previous example may desire to verify that the designer's intent is being implemented by the draftsman using the second CAx environment 112b, without immediately receiving any modifications to the component design 114 caused by the draftsman. For the purposes of this disclosure, the term "visualization setting" means data corresponding to one or more features, feature types, layers or other parameters which can be utilized to display a component design 114 in a CAx environment 112. Some example parameters include a light source or an orientation of a component design 114.

Figure 2C:
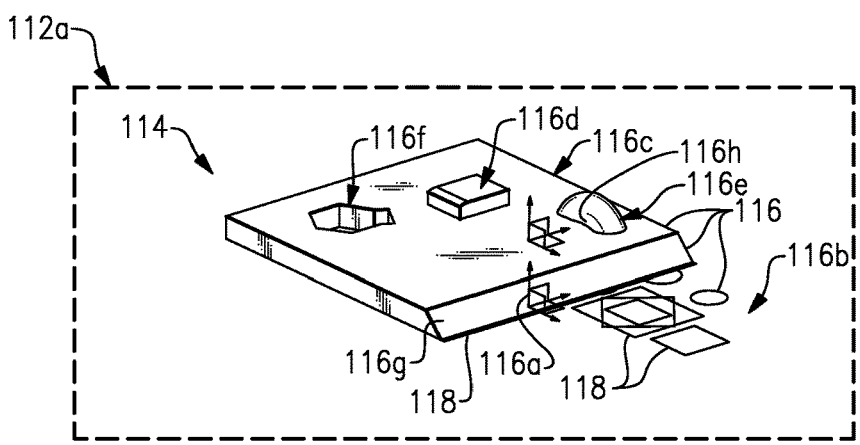
FIG. 2C illustrates another view of the sample component design of FIG. 2A, according to an embodiment.

For example, as shown in FIG. 2C the user of CAx environment 112a has received one or more visualization settings associated with the CAx environment 112b. The visualization settings include one or more features or feature types, or a layer created by the user of the CAx environment 112b, or another parameter characterizing the component design 114 in the CAx environment 112b, for example. As shown, the datum coordinate system 116a and sketch 116b are displayed in the CAx environment 112a. Features 116a, 116b may be created or modified in the part file utilizing CAx environment 112b before, during or after the transfer of visualization settings from the CAx environment 112b to the CAx environment 112a.

Figure 3A:
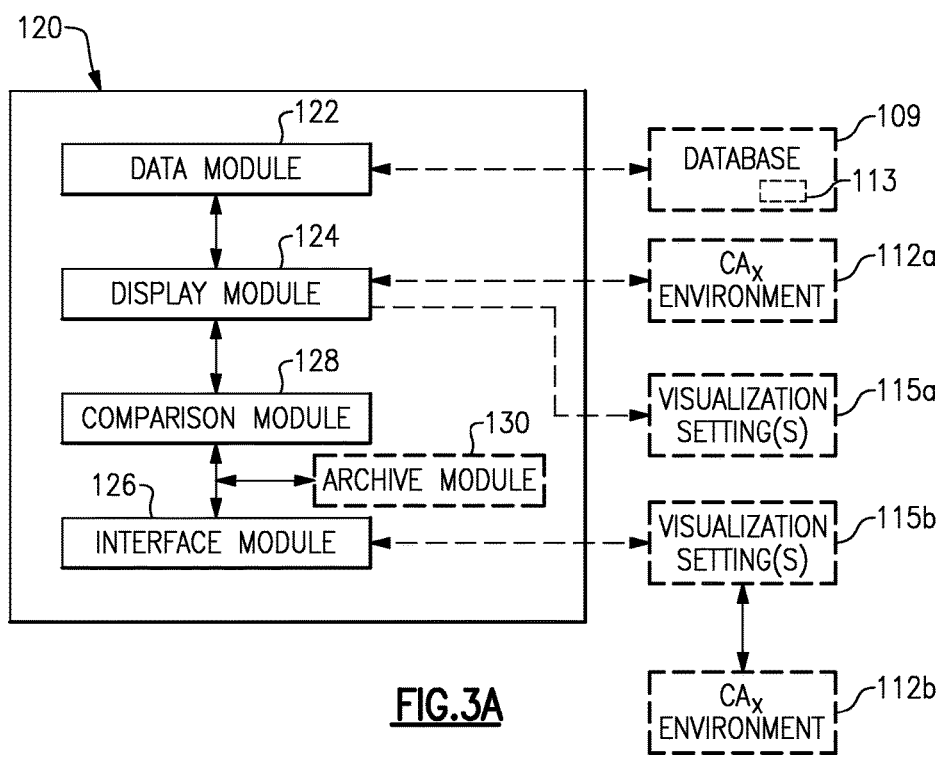
FIG. 3A illustrates an example system for component visualization, according to an embodiment.

FIG. 3A illustrates a CAx package 120 for visualization of a component design, according to an embodiment. The CAx package 120 is configured to accept visualization updates for display and/or sharing visualization settings between two or more CAx environments, such as the CAx environments 112a, 112b. In some examples, the CAx package 120 is provided as a portion of a CAx software tool. In other examples, the CAx package 120 is a standalone software program and is configured to interface a CAx software tool to provide the desired solution. The CAx package 120 can be provided by a tangible or non-transitory computer-readable storage medium and installed at one or more of the client computers 104 and/or the host computer 102, for example. The CAx package includes one or more modules to provide visualization of a component design. Each of these modules includes executable software instructions and/or digital or analog hardware circuitry.

The CAx package 120 includes a data module 122 configured to access one or more part files 113 each comprising data corresponding to a component design. In some embodiments, the part file(s) 113 is stored in a database 109 which is accessed by the data module 122. Each part file includes at least one feature corresponding to a feature type, such as any of the feature types discussed in this disclosure.

The CAx package 120 also includes a display module 124. The display module 124 is configured to display the data in a CAx environment 112, such as in one of the CAx environments 112a, 112b. The display of the data in the CAx environment 112 is provided according one or more visualization setting 115a.

The at least one visualization setting 115a corresponds to at least one feature type utilized to characterize a component design, and in other examples corresponds to a first profile. The first profile corresponds to a physical user, such as a user operating one of the client computers 104, an instance of a CAx environment 112, or a computing device configured to execute a CAx tool, for example. The at least one visualization setting 115a may be predefined during system initialization, provided as a default setting in the CAx software, or previously stored during system configuration. In some examples, the at least one visualization setting 115a is stored locally within the respective computing device executing the CAx software, and in another example, each visualization setting 115a is stored remotely such as in a storage system 108.

In some examples, the CAx package 120 includes an interface module 126 configured to receive a second visualization setting 115b. The second visualization setting 115b corresponds to at least featured type, and in other examples, also corresponds to a different profile. In some examples, the interface module 126 is configured to receive visualization setting(s) 115b from another CAx environment 112 such as CAx environment 112b, another computing device such as one of the client computers 104 or host computer 102, or from a storage system 108, for example. In another example, a part file, sub-assembly, or assembly is associated with or can otherwise be identified with one or more visualization settings 115b. In yet another example, the profile is a user profile or a group of user profiles which are associated or otherwise identified with one or more visualization settings 115*b*.

The CAx package 120 includes a comparison module 128 configured to cause the display module 124 to display data corresponding to a component design, such as data in the part file 113. In some examples, the comparison module 128 causes the display module 124 to display data in response to feature modifications or updates to the part file 113 when the feature(s) meet at least one predetermined criterion. In other examples, the comparison module 128 causes the display module 124 to display data in response to receiving the second visualization setting 115*b* when the second visualization setting 115*b* meets at least one predetermined criterion.

In one example, the at least one predetermined criterion is based upon at least one feature type, including any of those described in this disclosure. In another example, the at least one predetermined criterion is based on at least one feature of a component design. In another example, the predetermined criterion is based on at least one layer corresponding to at least one feature or featured type. In yet another example, the predetermined criterion is based on the editing state of the CAx environment 112*a* associated with the comparison module 128.

Other predetermined criteria are contemplated. In some examples, the at least one predetermined criterion is based on at least one of a part identifier and an assembly identifier, each of which corresponds to a part file or a component design. For example, the assembly identifier may correspond to a group of different parts, each part associated with a part identifier. In yet another example, the predetermined criterion is based on an entity list corresponding to one or more profiles, such as a user profile or group of user profiles, provided with a CAx environment 112.

In some examples, the comparison module 128 evaluates the feature update(s) and/or visualization setting 115*b* according to more than one predetermined criterion, such as any of those discussed in this disclosure. In other examples, the comparison module 128 compares the feature update(s) or multiple visualization settings to at least one predetermined criterion to permit at least one feature update or visualization setting to be accepted and at least one other feature or visualization setting to be declined. For example, the comparison module 128 may accept feature updates corresponding to a solid feature type, but deny or block feature updates corresponding to a sketch feature type. In another example, the comparison module 128 accepts visualization settings 115*b* associated with a sketch feature type, but declines or blocks another visualization setting such as a datum feature type.

In some examples, the CAx package 120 includes an archive module 130 configured to store and retrieve the visualization setting 115*a*. For example, a user provided with a CAx environment 112 may desire to receive a visualization setting 115*b* and update the CAx environment 112*a* accordingly. Thereafter, once collaboration with another user is completed, the user may desire to revert back to the first visualization setting(s) 115*a*. This increases efficiency in the design process by reducing the number of operations to be able to select the desired visualization settings 115. In other examples, the archive module 130 is configured to store visualization settings 115 from other users which can be retrieved at a later time.

Figure 3B:
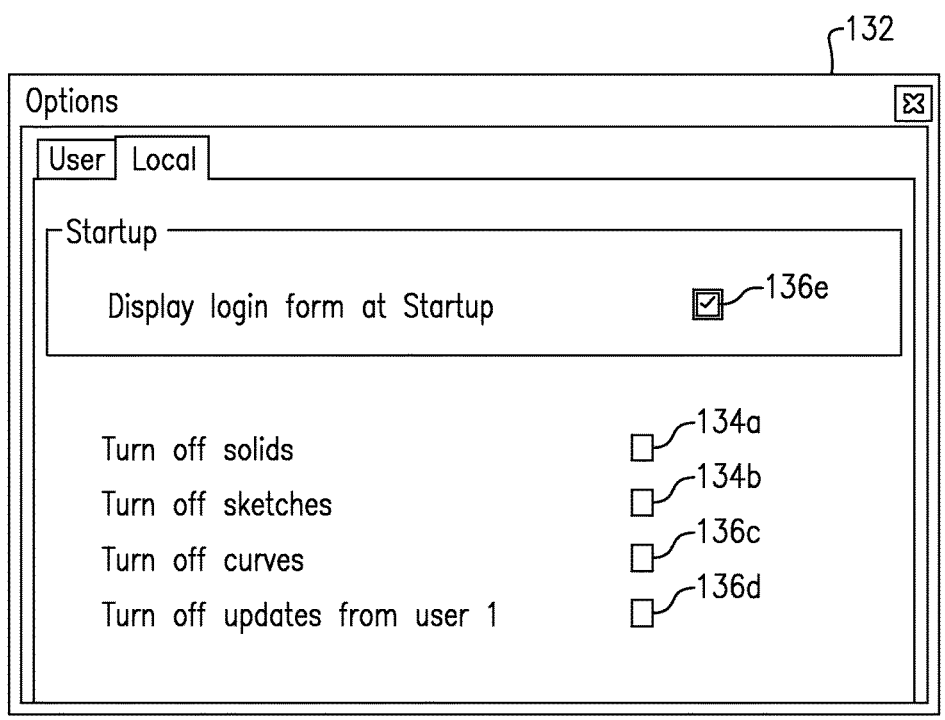
FIG. 3B illustrates an example graphical user interface (GUI), according to an embodiment.

FIG. 3B shows a GUI 132 provided with an example CAx tool for allowing a user to select one or more visualization settings in a CAx environment 112, according to an embodiment. A user can select whether or not the user wants to view solid features by selecting box 134*a*, for example. The user can also indicate whether to display sketches by selecting or deselecting box 134*b*, and whether to display one or more geometric features, such as curves, by selecting box 136*c*. In the example GUI 132, the user can also indicate whether to view modifications or updates to a component design from a particular user by selecting or deselecting box 136*d*. The user may also indicate whether to customize visualization settings corresponding to a CAx environment 112 at startup by selecting or deselecting box 136*e*. In another example, the user is able to manually select these features during execution of a CAx environment 112. Although the example GUI 132 includes check boxes, in other embodiments other input mechanisms may be used, including a dropdown menu, toolbar, keystrokes, etc.

Figure 4A:
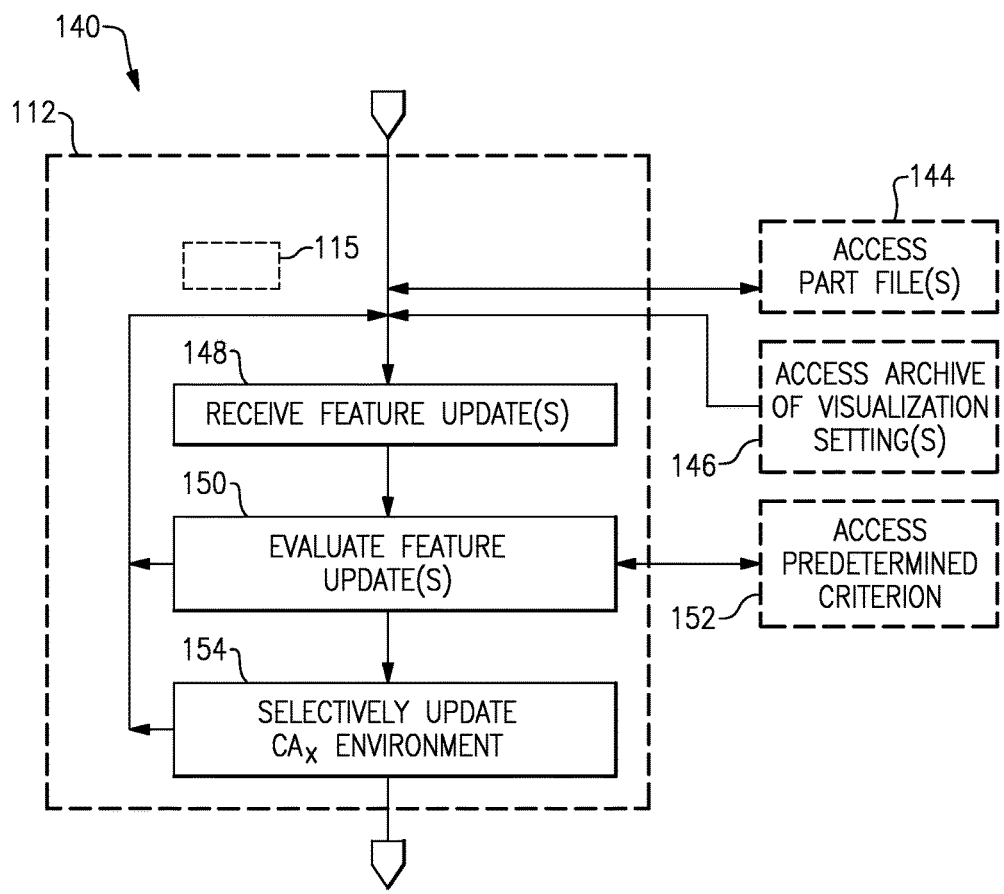
FIG. 4A illustrates a process for accepting visualization updates to a component design in a CAx environment, according to an embodiment.

FIG. 4A illustrates a visualization process or algorithm in a flowchart 140 for accepting visualization updates to a component design in a CAx environment 112 configured to display a component design according to at least one visual setting 115. Each visualization setting 115 corresponds to at least one feature type, feature, and/or layer. In other examples, each visualization setting 115 corresponds to a user profile associated with the CAx environment 112. In some examples, the visualization algorithm 140 accesses at least one part file at block 144. In another example, the visualization algorithm 140 retrieves or otherwise accesses a visualization setting at block 146, which may have been previously saved or archived prior to execution of the visualization algorithm 140.

At least one update or modification to the part file(s) is received at block 148. The modification is made in another user associated with a profile or another CAx environment 112, for example, and includes at least one new or modified feature comprising a component design and saved in the part file.

At block 150 the visualization algorithm 140 evaluates whether the new or modified feature(s) to the part file(s) meets at least one predetermined criterion. In some examples, the at least one predetermined criterion is accessed at block 152. The at least one predetermined criterion can include any feature type(s) or feature(s) comprising a component design 114, including any features 116 and feature types discussed in this disclosure, and any layer(s) previously defined. In another example, the predetermined criterion is based on an editing state of the CAx environment 112 when the new or modified feature(s) are made to the part file(s). In yet another example, the predetermined criterion is based on a predetermined time threshold. For example, the user provided with the CAx environment 112 may indicate to deny visualization updates for a period of time, but allow or accept visualization updates once the period of time has elapsed.

In some examples, a user provided with the CAx environment 112 is provided with a notification that visualization updates corresponding to one or more features in a part file are available. In one embodiment, the notification is a message. In another embodiment, the notification is a preview of the feature(s) associated with component design 114, and can be shown in partial transparency, for example. In yet another embodiment, the CAx environment 112 modifies a local copy of a part file and periodically polls a central copy of the part file for updates.

At block 154 the CAx environment 112 is updated if the feature(s) meet the at least one predetermined criterion. This causes the CAx environment 112 to display the new or modified feature(s) to the part file(s). In other examples, the CAx environment 112 is updated to display at least one feature and blocks at least one other feature depending on whether each of the features meets the at least one of the predetermined criterion. For example, the CAx environment 112 may be updated to display some features such as sketches, and blocks other features such as solids. In another example, the user provided with the CAx environment 112 manually indicates whether to accept the visualization updates made by another user.

Figure 4B:
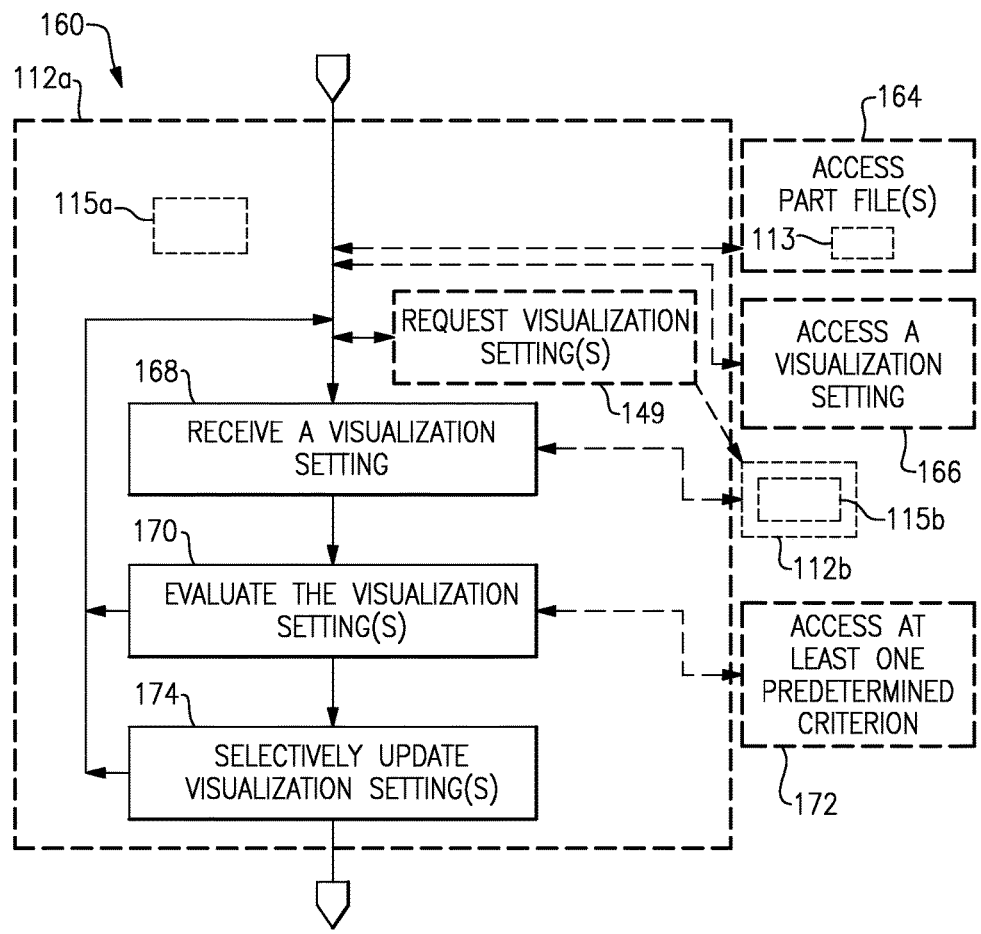
FIG. 4B illustrates a process for sharing visualization settings between two CAx environments, according to an embodiment.

FIG. 4B illustrates a process or algorithm in a flowchart 160 for sharing visualization settings between at least two CAx environments 112, according to an embodiment. For illustrative purposes, the CAx environment 112a of FIGS. 2A and 2C will be referred to as a first CAx environment, and the CAx environment 112b of FIG. 2B will be referred to as a second CAx environment, although sharing between any two or more CAx environments 112 is contemplated with the teachings of this disclosure.

The first visualization setting 115a corresponds to at least one feature type. In another example, the first visualization setting 115a corresponds to a first profile, such as a user profile. The component design includes at least one feature that corresponds to a group of feature types. In some examples, the sharing algorithm 160 accesses the component design stored in a part file 113 at block 164. In another example, the sharing algorithm 160 accesses a visualization setting 115 at block 146, which may have been previously archived or otherwise saved.

At block 168 a remote or second visualization setting(s) 115b is received from a second CAx environment 112b. In some examples, the second visualization setting(s) 115b corresponding to a second, different profile, such as a different user profile. In another example, the second visualization setting 115b corresponds to at least one feature type. For example, the second visualization setting 115b can include multiple visualization settings corresponding to various feature(s), feature type(s) and/or layer(s) utilized in the second CAx environment 112b. In another example, the second visualization setting 115b includes a spatial orientation of a component design as viewed in the second CAx environment 112b.

The second visualization setting 115b can be accessed by the first CAx environment 112a utilizing various techniques. In one embodiment, the second visualization setting 115b is received in response to modification of the part file(s) 113. In some embodiments, the second visualization setting 115b is "pushed" by the second CAx environment 112b to the first CAx environment 112a after a modification to the part file(s) 113. In another embodiment, the visualization algorithm 140 requests or "pulls" the visualization setting 115b from the second CAx environment 112b or another user at block 149.

At block 170 the sharing algorithm 160 evaluates whether the second visualization setting 115b meets at least one predetermined criterion. In some examples, the at least one predetermined criterion is accessed at block 172. Various criteria are contemplated. The at least one predetermined criterion can include any feature types or feature comprising a component design, including any features and feature types discussed in this disclosure. For example, the user of the first CAx environment 112a may indicate that any visualization settings 115b corresponding to a particular feature or feature type should be blocked, while visualization settings 115b corresponding to another feature or feature type can be accepted, even though related visualization setting(s) 115a have not been previously activated or selected in the first CAx environment 112a.

In some examples, the predetermined criterion is based on one or more layers each associated with the first CAx environment 112a. In one example, the second visualization setting 115b is accepted if the feature and/or feature type of the component design is associated with the layer(s). In another example, the second visualization setting 115b is blocked if the feature and/or feature type of the component design is associated with the layer(s). In another example, the second visualization setting 115b is accepted if the feature and/or feature type of the component design is associated with the layer(s), even though the feature and/or feature type is also associated with a predetermined criterion based on another layer(s) designated to block the feature and/or feature type. In another example, the second visualization setting 115b is blocked if the feature and/or feature type of the component design is associated with the layer(s), even though the feature and/or feature type is also associated with a predetermined criterion based on another layer(s) for accepting the feature and/or feature type.

Other criteria are contemplated. In one example, the predetermined criterion is based on an editing state of the first CAx environment 112a. In another example, the predetermined criterion is based on a predetermined time threshold. For example, the user provided with the first CAx environment 112a may indicate to deny the second visualization setting 115b for a period of time, but allow or accept the second visualization settings 115b once the period of time has elapsed.

In some embodiment, the user accessing the first CAx environment 112a manually accepts or blocks the second visualization setting 115b. In one embodiments, the first CAx environment 112a provides a notification that the second visualization setting 115b is available. In one embodiment, the notification is a message. In another embodiment, the notification is a preview of the feature(s) and/or feature type(s) associated with the visualization setting 115b, with the relevant feature(s) shown in partial transparency, for example. Thereafter, the user manually indicates whether to accept the second visualization setting 115b.

At block 154 the second visualization setting 115b associated with the second CAx environment 112b is accepted by the first CAx environment 112a when the at least one predetermined criterion is met. This causes the CAx tool to display the component design in the first CAx environment 112a according to the second visualization setting 115b. In some examples, the second visualization setting 115b includes multiple visualization settings, and each of the visualization settings is selectively displayed or blocked depending on whether the each visualization setting meets the at least one predetermined criterion. In other examples, the CAx environment 112a is updated to display only the second visualization setting 115b, and not any of the first visualization settings 115a.

Thereafter, the user accessing the first CAx environment 112a can revert back to the first visualization setting(s) 115a, which may be archived at block 166. In some examples, the first visualization setting(s) 115a are restored in the first CAx environment 112a in response to a manual selection made by a user, and in other examples, the first CAx environment 112a restores the first visualization setting(s) 115a after a predetermined period of time. Of course, other techniques for updating the first CAx environment 112a to reflect various visualization settings are contemplated with the teachings of this disclosure.

The visualization algorithm 140 and/or sharing algorithm 160 can programmed in the CAx software directly, provided as one or more software plug-ins adapted to work with the native CAx software, or provided in a standalone program to interface with a CAx package to provide the desired solution. While the CAx package 120 and the algorithms 140, 160 are described above in the context of a multi-user CAx environment executed on at least one host computer 102 or client computer 104, it should be understood that other CAx tools and architectures may benefit from the teachings of this disclosure. It should also be understood that the host computer 102, client computer 104 or other computing device running the multi-user CAx environment 112 can be programmed with multiple additional tools, and the various features and tools included can be configured to interoperate with each other according to known principles.

Although the discussed examples illustrate a specific component, examples or embodiments of this disclosure are not limited to those particular combinations. One of skill in the art having the benefit of this disclosure will recognize that it is possible to use some of the components or features from one of the examples in combination with features or components from another one of the examples. Furthermore, various embodiments may include one or more examples within them, while other embodiments may include a different subset of examples. In addition, it will be understood that in various embodiments, a module may be a single module, or in some embodiments, the function of a single module may incorporate the features of multiple modules.

Furthermore, the foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A multi-user computer aided design (CAx) system including a system for component visualization, comprising:
    a first computing device including a processor and a memory configured to execute a host multi-user CAx environment;
    a plurality of second computing devices, each including a processor and a memory, and being configured to execute a corresponding user multi-user CAx environment, the user multi-user CAx environment providing access to the host multi-user CAx environment;
    a data module stored on said first computing device, the data module being configured to access data corresponding to a component design, the component design including at least one feature having a group of feature types;
    a display module stored on said first computing device, the display module being configured to cause one of the computing devices in the plurality of second computing devices to display the data in a first local environment according to a first visualization setting and to cause another of the computing devices in the second computing devices to display the data in a second local environment according to a second visualization setting, and configured to display the at least one feature in the first CAx environment when at least one predetermined criterion is met, wherein the at least one predetermined criterion is at least partially based on an entity list corresponding to the second user profile; and
    a comparison module configured to compare the second visualization setting to the first visualization setting in response to a feature update originating from the computing device having the first visualization setting, and configured to alter the second visualization setting to cause the feature update to be visible in the second visualization setting in response to the feature update originating from the computing device having the first visualization setting.

2. The multi-user computer aided design (CAx) system as recited in claim 1, wherein the group of feature types includes at least one of a datum, a geometrical shape, a sketch, an extrusion, and a surface feature.

3. The multi-user computer aided design (CAx) system as recited in claim 1, wherein the at least one predetermined criterion is at least partially based on the group of feature types.

4. The multi-user computer aided design (CAx) system as recited in claim 3, wherein the at least one predetermined criterion is at least partially based on at least one layer corresponding to the group of feature types.

5. A multi-user computer aided design (CAx) system for component visualization, comprising:
    a first computing device including a processor and a memory configured to execute a first multi-user CAx environment;
    a plurality of second computing devices, each including a processor and a memory, and being configured to execute a corresponding user multi-user CAx environment, the user multi-user CAx environment providing access to the first multi-user CAx environment;
    a data module stored on said first computing device, the data module being configured to access data corresponding to a component design, the component design including at least one feature corresponding to a group of feature types;
    a display module stored on said first computing device, the display module being configured to display the data in an environment according to a first visualization setting corresponding to a first user profile and corresponding to the group of feature types, and configured to display at least one feature in the first CAx environment when at least one predetermined criterion is met, wherein the at least one predetermined criterion is at least partially based on an entity list corresponding to the second user profile;
    a comparison module stored on said first computing device, the comparison module being configured to cause the display module to display the data according to a second visualization setting of a second computing device when the at least one feature would not be displayed under the first visualization setting; and
    wherein the second visualization setting corresponds a second user profile, and the second user profile originates the at least one feature.

6. The multi-user computer aided design (CAx) system as recited in claim 5, wherein the group of feature types includes at least one of a datum, a geometrical shape, a sketch, an extrusion, and a surface feature.

7. A method for designing a component, comprising the steps of:
    displaying a component design according to a first visualization setting in a first computer aided design (CAx) environment of a multi-user CAx system, the first visualization setting corresponding to a first user profile and being configured to display a group of feature types, the component design including at least one feature in the group of feature types, and configured to display the at least one feature in the first CAx environment when at least one predetermined criterion is met, wherein the at least one predetermined criterion is at least partially based on an entity list corresponding to the second user profile;

the multi-user CAx system including at least a host computer executing a host CAx environment including the component design, a first computer executing the first CAx environment, and a second computer executing a second CAx environment, the first CAx environment including the first visualization setting corresponding to a first user profile and the second CAx environment including a second visualization setting corresponding to a second user profile of the host CAx environment and providing user access to the component design; and the host CAx environment including a comparison module configured to alter a portion of the second visualization setting to match a corresponding portion of the first visualization setting in response to a feature update from the first computer.

8. The method of claim 7, wherein the group of feature types includes at least one of a datum, a geometrical shape, a sketch, an extrusion, and a surface feature.

9. The method of claim 7, wherein the corresponding portion of the second visualization setting includes filtering criterion corresponding to the at least one feature.

* * * * *